(12) United States Patent
Bradley (10) Patent No.: US 9,588,212 B1
(45) Date of Patent: Mar. 7, 2017

(54) METHOD OF CALIBRATING A MEASUREMENT INSTRUMENT FOR DETERMINING DIRECTION AND DISTANCE TO A SOURCE OF PASSIVE INTERMODULATION (PIM)

(71) Applicant: Anritsu Company, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 664 days.

(21) Appl. No.: 14/022,450

(22) Filed: Sep. 10, 2013

(51) Int. Cl.
*G01R 35/00* (2006.01)

(52) U.S. Cl.
CPC .................................. *G01R 35/005* (2013.01)

(58) Field of Classification Search
CPC ..................................................... G01R 35/005
USPC .......................................................... 324/601
See application file for complete search history.

(56) References Cited

U.S. PATENT DOCUMENTS

| | | | |
|---|---|---|---|
| 2,594,328 A | 4/1952 | Marchetti | |
| 4,274,047 A | 6/1981 | Hecken | |
| 4,991,098 A | 2/1991 | Dantzler | |
| 5,479,090 A | 12/1995 | Schultz | |
| 5,513,094 A | 4/1996 | Stanley | |
| 5,602,709 A | 2/1997 | Al-Dabbagh | |
| 5,706,010 A | 1/1998 | Franke | |
| 5,729,145 A | 3/1998 | Blades | |
| 5,973,568 A | 10/1999 | Shapiro | |
| 5,994,905 A | 11/1999 | Franchville | |
| 6,144,692 A | 11/2000 | Beck | |
| 7,068,096 B2 | 6/2006 | Chu | |
| 7,103,114 B1 | 9/2006 | Lapierre | |
| 7,469,190 B2 | 12/2008 | Bickel | |
| 7,511,472 B1 | 3/2009 | Xia | |
| 7,598,714 B2 | 10/2009 | Stanley | |
| 7,629,764 B2 | 12/2009 | Shoemaker | |
| 7,696,850 B2 | 4/2010 | Stanford | |
| 7,696,940 B1 | 4/2010 | MacDonald | |
| 8,058,880 B2 | 11/2011 | Bradley et al. | |

(Continued)

FOREIGN PATENT DOCUMENTS

| | | |
|---|---|---|
| WO | 03030416 | 4/2003 |
| WO | 2004017516 | 2/2004 |
| WO | 2012009757 | 1/2012 |

OTHER PUBLICATIONS

Bell, et al., Range to Fault Technology, 2011, 10 pages, Kaelus.

(Continued)

*Primary Examiner* — Melissa Koval
*Assistant Examiner* — Courtney McDonnough
(74) *Attorney, Agent, or Firm* — Tucker Ellis LLP (57) ABSTRACT

A method of calibrating a passive intermodulation (PIM) measurement device configured to transmit radio frequency (RF) signals and receive PIM signals using a directional antenna includes arranging the PIM measurement device connected to the directional antenna so that the directional antenna is configured to transmit an RF signal having a substantially unobstructed boresight axis, transmitting the RF signal, and obtaining a PIM measurement using the PIM measurement device. The PIM measurement device can then be calibrated based on the obtained PIM measurement.

18 Claims, 7 Drawing Sheets

(56) References Cited

U.S. PATENT DOCUMENTS

| | | |
|---|---|---|
| 8,294,469 B2 | 10/2012 | Bradley |
| 8,498,582 B1 | 7/2013 | Bradley |
| 8,666,322 B1 | 3/2014 | Bradley |
| 8,816,672 B1 | 8/2014 | Bradley |
| 8,903,324 B1 | 12/2014 | Bradley |
| 2002/0030871 A1 | 3/2002 | Anderson |
| 2002/0094785 A1* | 7/2002 | Deats ............... H04B 1/1027 455/67.13 |
| 2003/0232600 A1 | 12/2003 | Montgomery |
| 2005/0141602 A1 | 6/2005 | Hyun |
| 2006/0202900 A1 | 9/2006 | Simile |
| 2009/0096466 A1 | 4/2009 | Delforce |
| 2009/0124122 A1 | 5/2009 | Stanford |
| 2009/0125253 A1 | 5/2009 | Blair |
| 2010/0029553 A1 | 2/2010 | Scheibel |
| 2010/0052652 A1 | 3/2010 | Mitchell |
| 2010/0085061 A1* | 4/2010 | Bradley ............ H04B 17/0085 324/520 |
| 2010/0164504 A1 | 7/2010 | Bradley |
| 2010/0194382 A1 | 8/2010 | Montena |
| 2010/0295533 A1 | 11/2010 | Kuga |
| 2012/0086612 A1 | 4/2012 | Linehan |
| 2013/0071112 A1 | 3/2013 | Melester |
| 2013/0182753 A1 | 7/2013 | Delforce |
| 2013/0310023 A1* | 11/2013 | Bevan ............... H04B 1/1027 455/423 |
| 2014/0146866 A1 | 5/2014 | Strachan |

OTHER PUBLICATIONS

Lui, Passive Intermodulation Interference in Communication Systems, Jun. 1990, pp. 109-118, vol. 2, Issue 3, Electronics & Communication Engineering Journal.

Eron, PIM Requirements for Low Power Wireless Components and Subsystems, White Paper, 4 pages, Microlab.

Hartman, et al., PIM Test Power Levels for Mobile Communications Systems, 2012, 8 pages, Kaelus.

Holzman, Essentials of RP and microwave grounding, Chapter 4: Transmission Line Transitions, 2006, 31 pages, Artech House, Inc.

* cited by examiner

METHOD OF CALIBRATING A MEASUREMENT INSTRUMENT FOR DETERMINING DIRECTION AND DISTANCE TO A SOURCE OF PASSIVE INTERMODULATION (PIM)

CROSS-REFERENCE TO RELATED APPLICATIONS

The present application is related to U.S. patent application Ser. No. 14/022,463, which is incorporated by reference herein.

TECHNICAL FIELD

The present invention relates to instruments and methods for measuring passive intermodulation (PIM) that can affect devices, systems, and networks.

BACKGROUND

Passive intermodulation (PIM), commonly referred to as "rusty bolt effect," is the generation of unwanted signals by the non-linear mixing of two or more frequencies in a passive device, such as a connector or cable, that normally behaves linearly but when subject to high radio frequency (RF) power tones behaves nonlinearly. Non-linear behavior can result, for example, from a loose or corroded connector or from the close proximity of the device to oxidized metal. Non-linear behavior affecting a system emitting RF signals can also result from the re-radiation of emitted signals, for example from antennas that are outside of, and unrelated to, the system. PIM is created when two signals from different systems or the same system combine and are then reflected at a PIM source, and can be reduced or eliminated by replacing the PIM source. For example, PIM is commonly resolved by replacing faulty cables or connectors, or by removing re-radiating sources.

PIM has surfaced as a problem for cellular telephone technologies such as Global System for Mobile Communications (GSM), Advanced Wireless Service (AWS) and Personal Communication Service (PCS) systems. Cable assemblies connecting a base station to an antenna on a tower typically have multiple connectors that can act as sources of PIM that interfere with cellular system operation. Further, a cellular system may be located near re-radiating sources that can act as sources of PIM that interfere with operation. If the generated PIM harmonic frequency components fall within the receive band of a base station, they can effectively block a channel and make the base station receiver think that a carrier signal is present when one is not. Generally the harmonics of concern are third, fifth, and seventh order, where the third order is of greatest signal strength, and therefore, of primary concern.

PIM has also surfaced as a problem for lower power systems such as Distributed Antenna Systems (DAS) which comprise networks of spatially separated antenna nodes connected to a common source via a transport medium that provides wireless service within a geographic area or structure. DAS is often deployed to an environment with many potential sources of PIM through re-radiation of wireless signals.

Test systems are available to measure PIM, for example, by creating signals at two different frequencies, amplifying them, and providing them to a device under test (DUT). A return signal carrying the PIM is filtered to select a desired test frequency harmonic where PIM can be detected and PIM magnitude and a measurement of the distance to the PIM source is provided to a technician, enabling the technician to locate and replace the PIM source. Such a system is described, for example, in U.S. Pat. No. 8,294,469 entitled "PASSIVE INTERMODULATION (PIM) DISTANCE TO FAULT ANALYZER WITH SELECTABLE HARMONIC" issued to Bradley and incorporated herein by reference. PIM is measured in DAS with test systems used to measure PIM in cellular systems, but at lower powers to more closely match the operating powers of the DAS.

SUMMARY

In accordance with an embodiment, a method of calibrating a passive intermodulation (PIM) measurement device configured to transmit radio frequency (RF) signals and receive PIM signals using a directional antenna comprises arranging the PIM measurement device connected to the directional antenna so that the directional antenna is configured to transmit an RF signal having a substantially unobstructed boresight axis. An RF signal is then generated and transmitted and a PIM measurement is obtained using the PIM measurement device. The PIM measurement device is then calibrated based on the obtained PIM measurement. The method can comprise connecting the directional antenna to the PIM measurement device.

In an embodiment, the obtained PIM measurement is indicative of residual PIM associated with the PIM measurement device and PIM associated with the directional antenna. In an embodiment, calibrating the PIM measurement device includes storing residual PIM and PIM associated with the directional antenna in vector form for removal from subsequent measurements generated by the PIM measurement device.

In an embodiment, arranging the PIM measurement device includes arranging the PIM measurement device so that the directional antenna is configured to transmit an RF signal having a boresight axis that is one or both of at an upward angle relative to horizontal and substantially vertical.

In an embodiment, the method further comprises connecting a PIM calibration standard between the directional antenna and the PIM measurement device. In such an embodiment, the obtained PIM measurement is indicative of a known distance to a PIM generated by the PIM calibration standard.

In an embodiment, a method of measuring passive intermodulation (PIM) using a PIM measurement device for transmitting radio frequency (RF) signals and receiving PIM signals by way of a directional antenna comprises arranging the PIM measurement device connected to the directional antenna so that the directional antenna transmits an RF signal having a boresight axis directed toward one or more possible locations of PIM sources. One or more PIM measurements can be obtained from the one or more possible locations of PIM sources with the PIM measurement device. The method can further comprise identifying one or both of a direction and distance of the PIM source based on one or more PIM measurements obtained by the PIM measurement device.

In an embodiment, the method can further comprise arranging the PIM measurement device connected to the directional antenna so that the directional antenna is configured to transmit an RF signal having a substantially unobstructed boresight axis, transmitting a setup RF signal, obtaining a setup PIM measurement with the PIM measurement device, and calibrating the PIM measurement device based on the obtained setup PIM measurement. The obtained setup PIM measurement can be indicative of residual PIM associated with the PIM measurement device and PIM associated with the directional antenna. In an embodiment, calibrating the PIM measurement device includes storing residual PIM and PIM associated with the directional antenna in vector form for removal from subsequent measurements generated by the PIM measurement device.

In an embodiment, arranging the PIM measurement device includes arranging the PIM measurement device so that the directional antenna is configured to transmit an RF signal having a boresight axis that is one or both of at an upward angle relative to horizontal and substantially vertical.

In an embodiment, the method further comprises connecting a PIM calibration standard between the directional antenna and the PIM measurement device. An obtained PIM measurement is indicative of a known distance to a PIM generated by the PIM calibration standard.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the figure in which the part or element is first discussed.

Test systems can be used to measure passive intermodulation (PIM), for example, by creating signals at two different frequencies, amplifying them, and providing the signals through cables connecting a base station to antennas on a tower for the base station. Embodiments of systems and devices in accordance with the present invention can be used to measure PIM affecting a device, system, or network (collectively and broadly referred to as a device-under-test (DUT)) by transmitting test signals through the air and receiving reflected signals generated at a PIM source, rather than transmitting the test signals and receiving reflected signals generated at a PIM source through a cable or other solid medium.

As described above, faulty connectors or cables in a DUT can act as PIM sources. Such PIM sources can be identified by transmitting test signals within the DUT and measuring any response. However, bodies outside a device or system can also act as PIM sources by re-radiating signals transmitted by the device, system, or network. For example, antennas associated with unrelated systems have been known to re-radiate signals transmitted by antennas of cell sites, generating PIM that can interfere with the electrical performance of the cell site. Embodiments of systems and devices in accordance with the present invention can include directional antennas usable to identify an approximate direction of a PM source from a test signal transmission location and, in some embodiments, a distance to the PIM source from the test signal transmission location.

Figure 1:
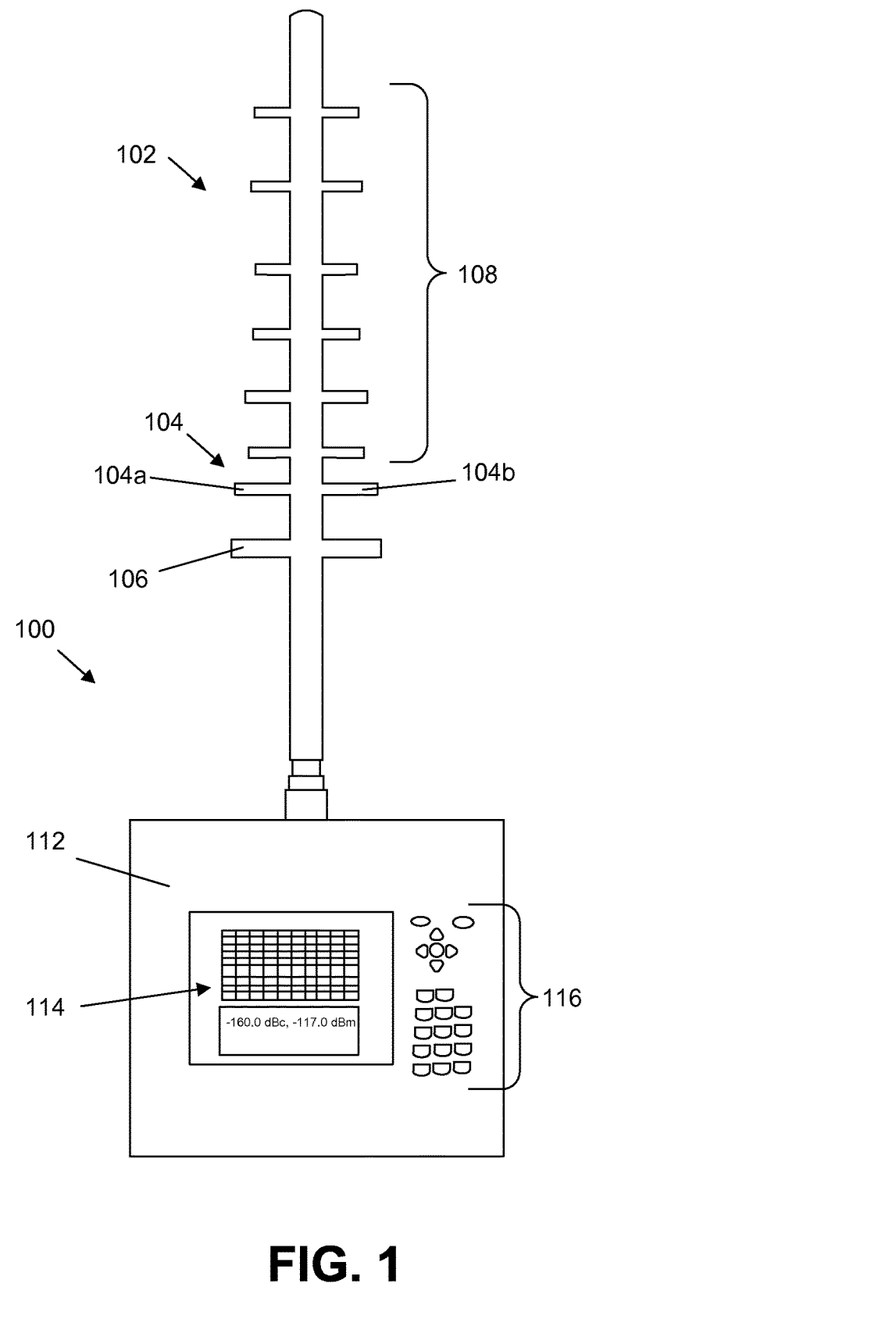
FIG. 1 illustrates an embodiment of a measurement instrument in accordance with the present invention for measuring passive intermodulation (PIM) by transmitting and receiving signals via an antenna.

FIG. 1 illustrates an embodiment of a measurement instrument 100 (also referred to herein as a measurement device) in accordance with the present invention for measuring passive intermodulation (PIM) by transmitting and receiving signals via an antenna 102. As shown, the antenna 102 is a directional antenna comprising a Yagi-Uda array, commonly known as a Yagi antenna. The antenna 102 includes a driven element 104 (a dipole, as shown) and parasitic elements in the form of a reflector 106 and multiple directors 108. The reflector 106 is slightly longer than the driven element 104, whereas the directors 108 are slightly shorter. As shown, the nine directors 108 are all of various lengths and spacing to achieve a target radiation pattern, but in other embodiments, the directors can have the same length and spacing, or can vary differently than as shown, depending on a desired radiation pattern.

The driven element 104 is the only component of the antenna 102 that is directly excited (i.e., electrically connected to a feedline). The reflector 106 and directors 108 are considered parasitic, re-radiating power received from the driven element 104 and interacting with each other. The design achieves an increase in the directionality and gain of the antenna over a simple dipole. The driven element 104 itself comprises a powered radiator 104a and a grounded radiator 104b, which are electrically isolated from each other.

As shown, the measurement instrument 100 includes a handheld, portable device for generating test signals and detecting PIM comprising a housing 112, display 114, and an input keypad 116. The portable device is merely exemplary. For example, the portable device need not include a keypad 116, but rather can take advantage of a touch screen overlay as a component of the display. Further, the antenna need not be connected with a handheld device, but rather can be connected via a coaxial cable, for example, to a larger, stationary device. Such an embodiment may benefit from operation by a pair of technicians, with one technician monitoring the results at the stationary device while the other technicians targets locations in the environment with the antenna. One of ordinary skill in the art will appreciate, upon reflecting on the teachings herein, the numerous different configurations of measurement instruments including a signal generator/analyzer and antenna.

Figure 2:
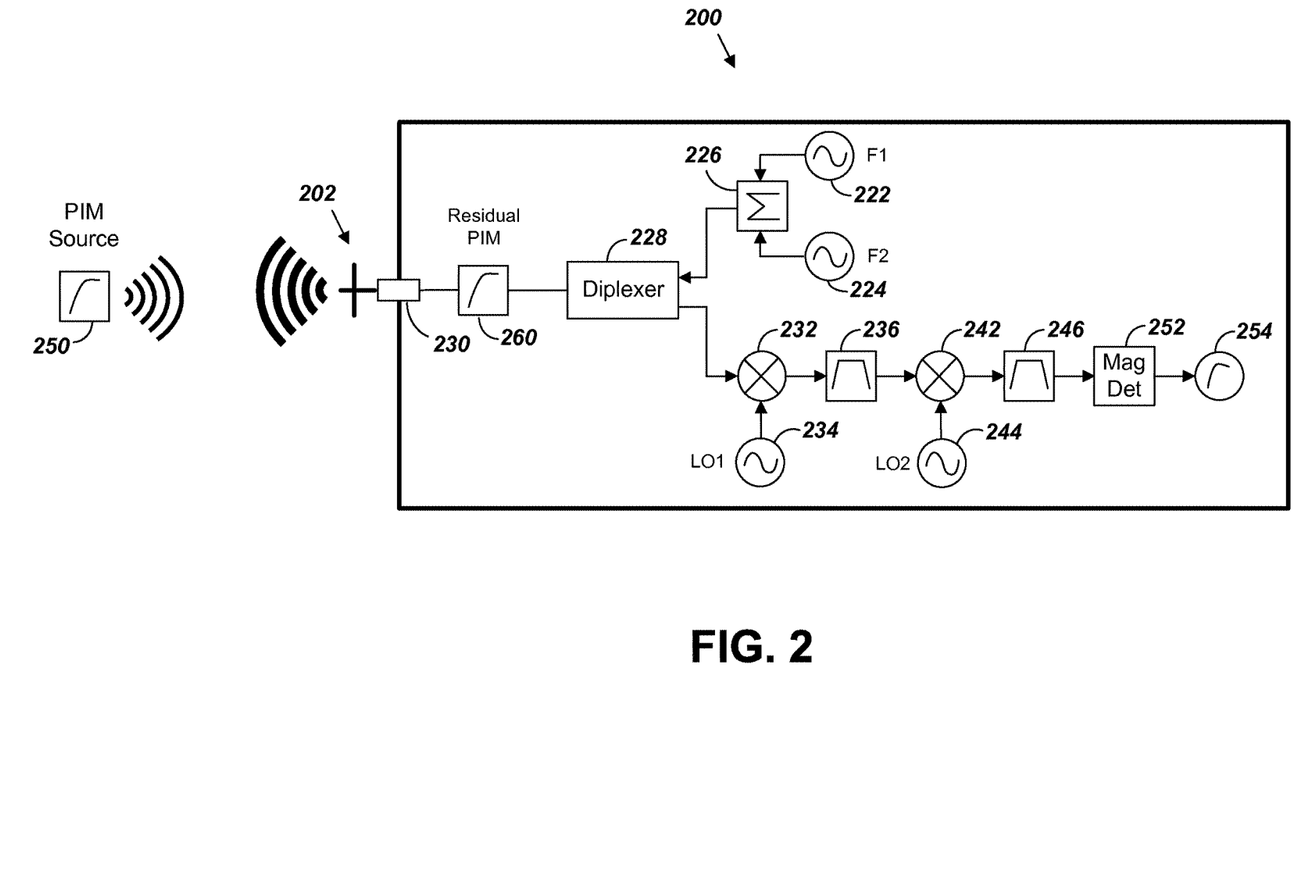
FIG. 2 is a simplified block diagram of a measurement setup for measuring PIM, the test system setup including system generated, residual PIM.

FIG. 2 is a block diagram of an exemplary measurement instrument 200 usable with an antenna 202 for measuring PIM generated by a PIM source and a distance to the PIM source using frequency modulated, continuous wave signals. The measurement instrument 200 resembles measurement instruments described, for example, in U.S. Pat. No. 8,058, 880 entitled "CALIBRATED TWO PORT PASSIVE INTERMODULATION (PIM) DISTANCE TO FAULT ANALYZER" issued to Bradley, et al. and incorporated herein by reference, and is merely exemplary. Embodiments of measurement instruments in accordance with the present invention can include different and/or additional components.

The measurement instrument 200 shown utilizes two signal sources, with a first signal source 222 producing a signal at frequency F1 and the second signal source 224 producing a signal at frequency F2. When these multiple signals are allowed to share the same signal path in a nonlinear transmission medium, the unwanted signals can occur. The third order response is particularly troublesome as it produces signals at 2F1-F2 as well as 2F2-F1. Test signals F1, F2 generated by the signal sources 222, 224 are provided to a combiner 226 to create a combined signal with frequencies F1 and F2 at the combiner output. The combined signal is sent to a test port 230 connected with the antenna 202, which transmits the combined signal, which can result in a reflected signal from a PIM source. A reverse or reflected signal from port 230 is then produced at frequency 2F1-F2, and forwarded to be downconverted to an intermediate frequency. The magnitude of the intermediate frequency signal is detected by a receiver and the PIM measurement is obtained.

A frequency modulated (FM) sweep is introduced using sweep generator 240 connected the first signal source 222. The frequency modulated sweep signal F1 and the fixed signal F2 when modified by the PIM source will produce the additional signals 2*(F1+FM)−F2 and 2*F2−(F1+FM). The delay in time (distance) signal 2*(F1+DF)−F2 can be mixed with an internally generated, non-delayed signal 2*(F1+FM)−F2 to produce the desired measurement signal ΔF. A distance-to-fault from the port 230 can be determined based on DF.

To provide a signal source for downconversion, a x2 frequency multiplier 238 connected to the first signal source 222 provides a swept output to a first input of a mixer 236. A second input of the mixer 236 is provided by the second signal source 224, to generate an output. A bandpass filter 234 eliminates undesired mixing products from the mixer 236 to provide a first input to a downconverting mixer 230. A second input of the downconverting mixer 230 is provided from a bandpass filter 228 that filters the reflected test signal from a PIM source 250. The inputs of the downconverting mixer 230 are downconverted at the output of the downconverting mixer 230, leaving substantially only the frequency deviation ΔF due to reflection of a test signal created by the PIM source 250. A lowpass filter 232 removes undesired mixing products, leaving only a forward trace sweep ΔF and retrace sweep signal 45 MHz−ΔF. Measurement of ΔF with a digital receiver using Fourier transform to time domain or a spectrum analyzer gives a measurement of total distance of the port 230 to the PIM source, with post processing to account for the both the forward sweep ΔF and retrace 45 MHz−ΔF.

The block diagram illustrates a further source of PIM (i.e. residual PIM) 260 within the measuring instrument. There are multiple internal mechanisms in a measuring instrument that can degrade over time including the test port connector, filters, or internal crosstalk between output power amplifier sources. The presence of residual PIM can corrupt the measurement of the device being measured. Once this residual PIM reaches a limit approaching the magnitude of the PIM generated by a PIM source, the measurement instrument becomes unusable and must be sent back to the factory for repair.

Figure 3:
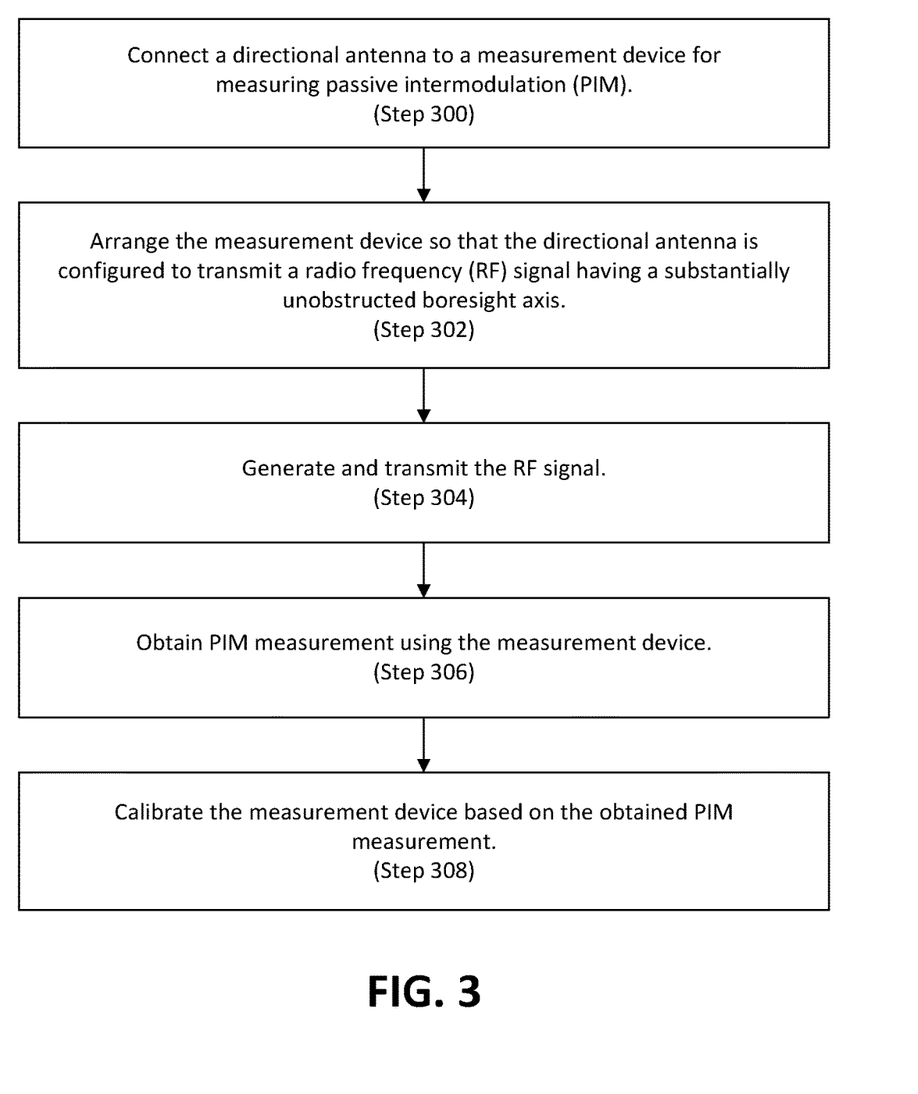
FIG. 3 is a flow chart of an embodiment of a method of calibrating the measurement instrument of FIG. 1.

FIG. 3 is a flow chart of an embodiment of a method of calibrating the measurement instrument of FIG. 1 in accordance with the present invention. Embodiments of methods of calibrating a measurement instrument that uses an antenna to transmit a signal can take advantage of the fact that a transmitted signal is not reflected by the atmosphere to account for residual PIM and PIM generated by the antenna and/or an interface of the antenna with the measurement instrument. The directional antenna is connected to a measurement device (Step 300) for measurement PIM and the measurement device is arranged so that the directional antenna is configured to transmit an RF signal having a substantially unobstructed boresight axis (Step 302). For example, an unobstructed boresight axis could be directed straight upwards into the sky, or at an angle at or above the horizon line. A user should take care to avoid buildings or structures that generate reflected signals. The RF signal is then generated and transmitted (Step 304) and a PIM measurement is obtained using the measurement device (Step 306). The measurement device is then calibrated based on the obtained PIM measurement (Step 308). The calibration can account for any residual PIM generated by the measurement device itself, as well as any PIM resulting from the antenna or at the interface of the antenna and the measurement device. Such calibration can reduce or eliminate false PIM results.

Figure 4:
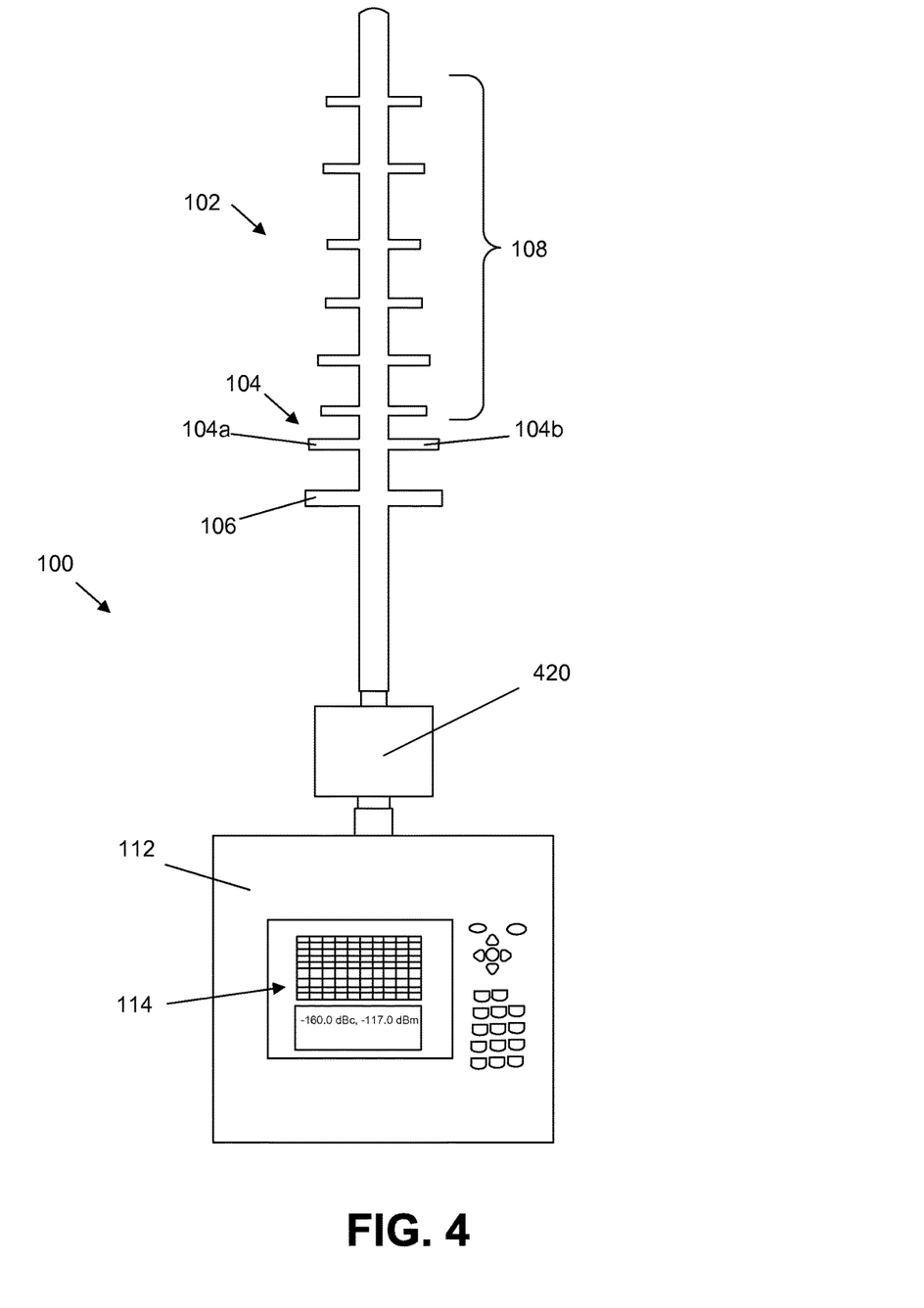
FIG. 4 illustrates the measurement instrument of FIG. 1 connected with a PIM source generating a known PIM.

FIG. 4 illustrates the measurement instrument 100 of FIG. 1 for measuring PIM connected with an antenna 102 for transmitting and receiving signals. The measurement instrument 100 further comprises a calibration standard 420 connected between the measurement device 100 and the antenna 102. The calibration standard 420 includes a PIM of a known magnitude, and can provide a reference for measuring distance.

Figure 5:
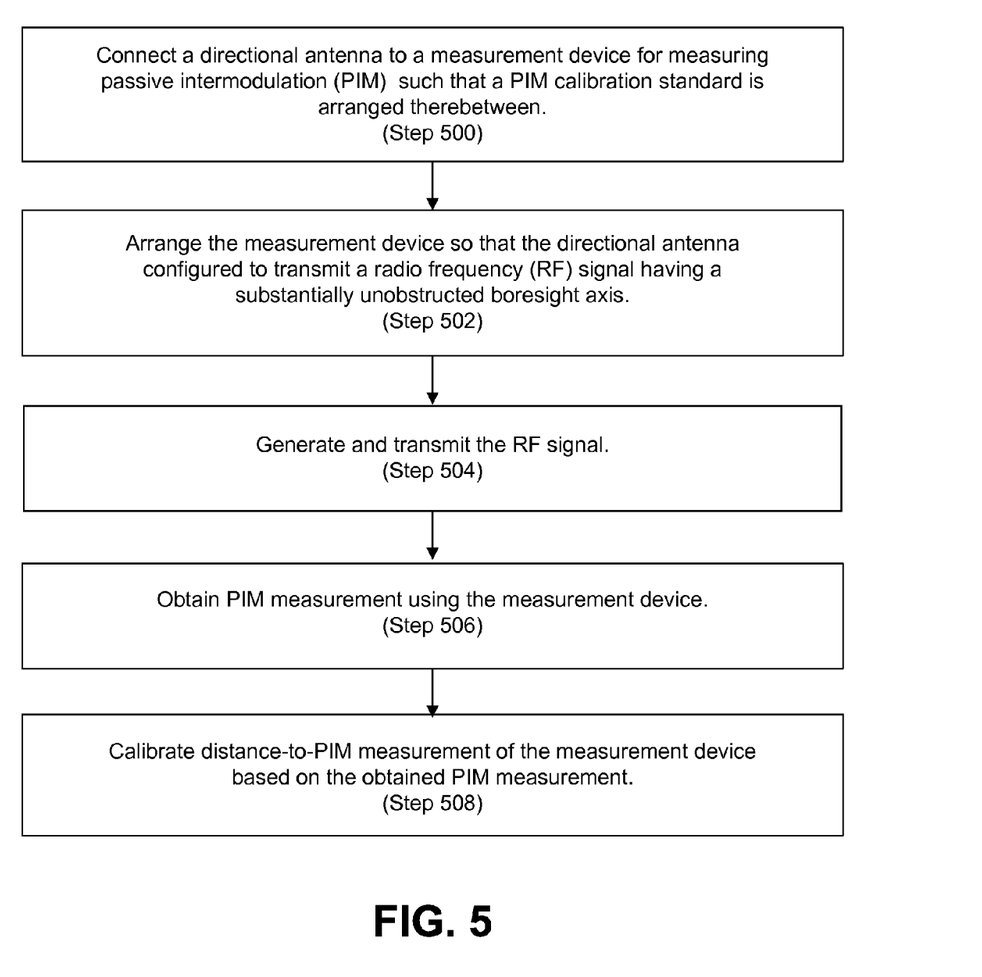
FIG. 5 is a flow chart of an embodiment of a method of calibrating the measurement instrument of FIG. 4 for distance-to-PIM measurements.

FIG. 5 is a flow chart of an embodiment of a method of calibrating the measurement instrument of FIG. 4 for distance-to-PIM measurements in accordance with the present invention. The directional antenna is connected to a measurement device (Step 300) for measuring PIM such that the PIM calibration standard is arranged therebetween (Step 500). The measurement device is arranged so that the directional antenna is configured to transmit an RF signal having a substantially unobstructed boresight axis (Step 502). For example, an unobstructed boresight axis could be directed straight upwards into the sky, or at an angle at or above the horizon line. A user should take care to avoid buildings or structures that generate reflected signals. The RF signal is then generated and transmitted (Step 504) and a PIM measurement is obtained using the measurement device (Step 506). The measurement device is then calibrated based on the obtained PIM measurement (Step 508). The calibration can account for any residual PIM generated by the measurement device itself, as well as any PIM resulting from the antenna or at the interface of the antenna and the measurement device, and also calibrates measurements of a distance to a PIM source, measurements of which are discussed, as noted above, in U.S. Pat. No. 8,294,469 entitled "PASSIVE INTERMODULATION (PIM) DISTANCE TO FAULT ANALYZER WITH SELECTABLE HARMONIC" issued to Bradley.

Figure 6:
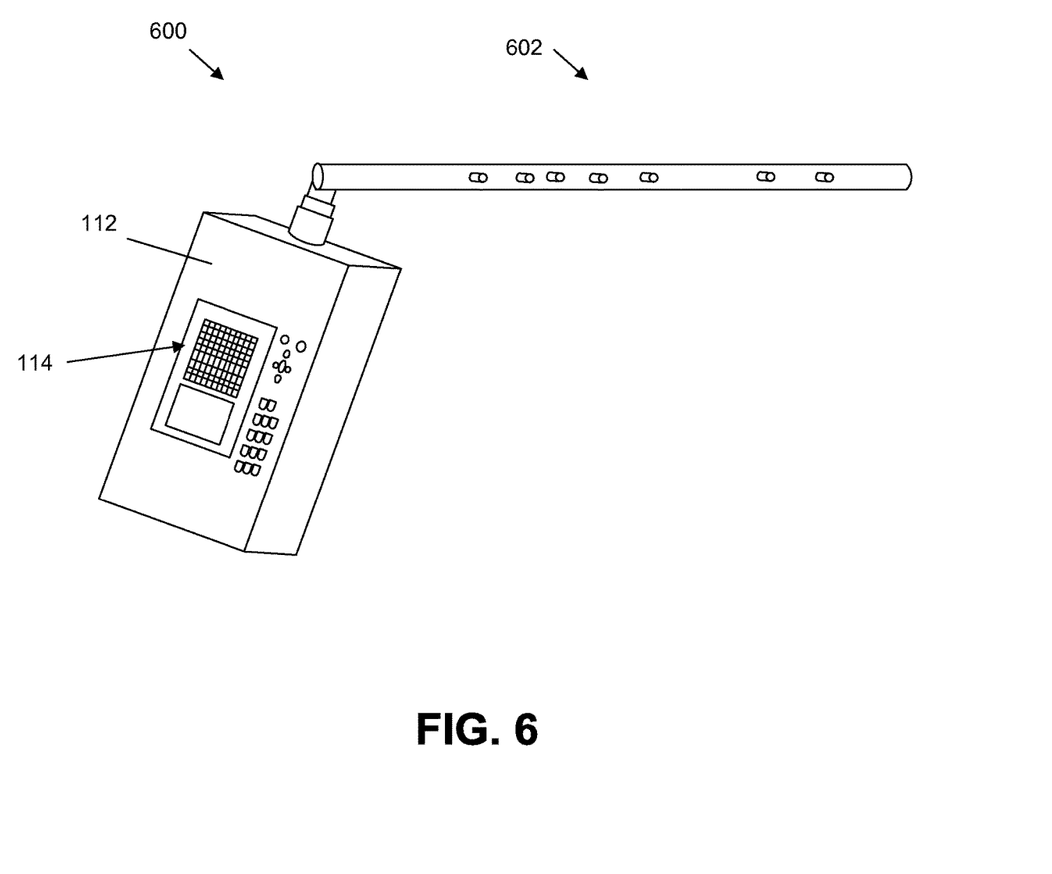
FIG. 6 illustrates the measurement instrument of FIG. 1 arranged to measurement PIM.

FIG. 6 illustrates a measurement instrument 600 resembling the measurement instrument 100 of FIG. 1 for measuring PIM connected with an antenna 602 for transmitting and receiving signals arranged to measure PIM in an environment. As shown, the antenna 602 can be articulated and is angled relative to the housing 112 of the portable device so that the display 114 of the portable device can be easily seen while measuring PIM and distance-to-PIM.

Figure 7:
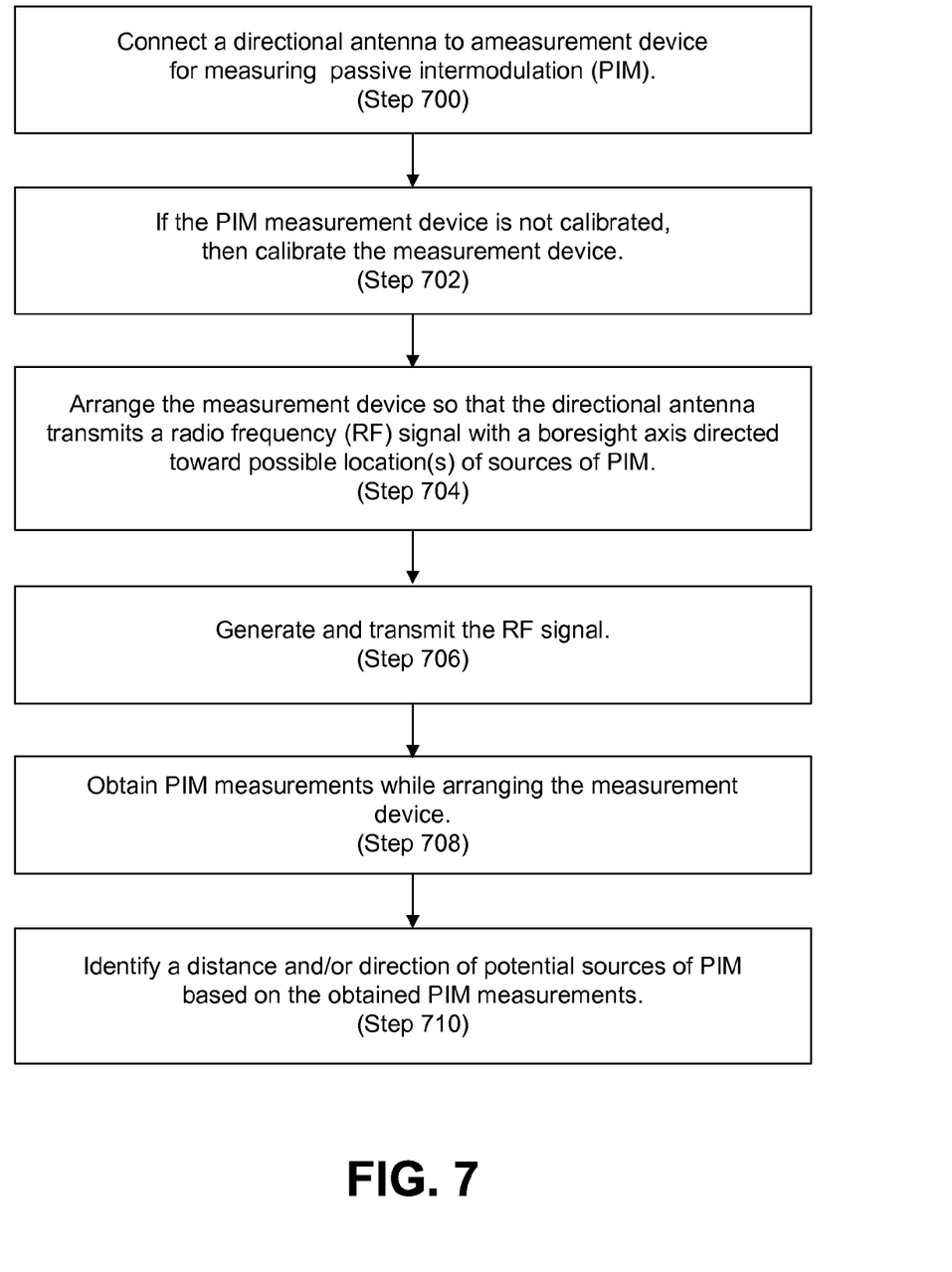
FIG. 7 is a flow chart of an embodiment of a method of identifying distance and/or direction of potential PIM sources using the measurement instrument of FIG. 1.

FIG. 7 is a flow chart of an embodiment of a method of measuring PIM and distance-to-PIM in with the present invention. The directional antenna is connected to the measurement device (Step 700). If the PIM measurement device is not calibrated, then the PIM measurement can be calibrated, as described above (Step 702). The measurement device is arranged so that the directional antenna is configured to transmit an RF signal with a boresight axis directed toward possible location(s) of sources of PIM (Step 704). The RF signal is then generated and transmitted (Step 706) and PIM measurements are obtained while arranging the measurement device at one or more locations (Step 708). A distance and at least an approximate direction of potential sources of PIM are identified based on the obtained PIM measurements (Step 710).

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method of calibrating a passive intermodulation (PIM) measurement device configured to transmit radio frequency (RF) signals and receive PIM signals using a directional antenna, comprising:
    arranging the PIM measurement device connected to the directional antenna so that the directional antenna is configured to transmit an RF signal having a substantially unobstructed boresight axis such that substantially no reradiation of the RF signal when transmitted is receivable by the PIM measurement device;
    transmitting the RF signal;
    obtaining a PIM measurement using the PIM measurement device; and
    calibrating the PIM measurement device based on the obtained PIM measurement.

2. The method of claim 1, further comprising connecting the directional antenna to the PIM measurement device.

3. The method of claim 1, wherein the obtained PIM measurement is indicative of residual PIM associated with the PIM measurement device and PIM associated with the directional antenna.

4. The method of claim 3, wherein calibrating the PIM measurement device includes storing residual PIM and PIM associated with the directional antenna for removal from additional PIM measurements obtain by the PIM measurement device.

5. The method of claim 1, wherein arranging the PIM measurement device includes arranging the PIM measurement device so that the directional antenna is configured to transmit an RF signal having a boresight axis that is one or both of at an upward angle relative to horizontal and substantially vertical.

6. The method of claim 2, further comprising connecting a PIM calibration standard between the directional antenna and the PIM measurement device.

7. The method of claim 6, wherein the obtained PIM measurement is indicative of a known distance to a PIM generated by the PIM calibration standard.

8. A method of calibrating a passive intermodulation (PIM) measurement device configured to transmit radio frequency (RF) signals and receive PIM signals using a directional antenna, comprising:
    arranging the PIM measurement device connected to a PIM calibration standard and the directional antenna so that the directional antenna is configured to transmit an RF signal having a substantially unobstructed boresight axis such that substantially no reradiation of the RF signal when transmitted is receivable by the PIM measurement device;
    transmitting the RF signal;
    obtaining a PIM measurement with the PIM measurement device; and
    calibrating the PIM measurement device based on the obtained PIM measurement.

9. The method of claim 8, further comprising connecting the PIM calibration standard to the PIM measurement device and connecting the directional antenna to the PIM calibration standard.

10. The method of claim 8,
    wherein the obtained PIM measurement is indicative of a known PIM of the PIM calibration, a residual PIM associated with the PIM measurement device, and PIM associated with the directional antenna;
    wherein the obtained PIM measurement is further indicative of a known distance to a PIM generated by the PIM calibration standard.

11. The method of claim 10, wherein calibrating the PIM measurement device includes storing residual PIM and PIM associated with the directional antenna for removal from additional PIM measurements obtained by the PIM measurement device.

12. The method of claim 8, wherein arranging the PIM measurement device includes arranging the PIM measurement device so that the directional antenna is configured to transmit an RF signal having a boresight axis that is one or both of at an upward angle relative to horizontal and substantially vertical.

13. A method of measuring passive intermodulation (PIM) using a PIM measurement device for transmitting radio frequency (RF) signals and receiving PIM signals by way of a directional antenna, comprising:
    arranging the PIM measurement device connected to the directional antenna so that the directional antenna is configured to transmit an RF signal having a substantially unobstructed boresight axis such that substantially no reradiation of the RF signal when transmitted is receivable by the PIM measurement device;
    transmitting a setup RF signal;
    obtaining a setup PIM measurement with the PIM measurement device;
    calibrating the PIM measurement device based on the obtained setup PIM measurement;
    arranging the PIM measurement device connected to the directional antenna so that the directional antenna transmits an RF signal having a boresight axis directed toward one or more possible locations of PIM sources;
    obtaining one or more PIM measurements from the one or more possible locations of PIM sources with the PIM measurement device; and
    wherein when the obtained one or more PIM measurements indicate a PIM source, identifying one or both of a direction and distance of the PIM source based on the obtained one or more PIM measurements.

14. The method of claim 13, wherein the obtained setup PIM measurement is indicative of residual PIM associated with the PIM measurement device and PIM associated with the directional antenna.

15. The method of claim 14, wherein calibrating the PIM measurement device includes storing residual PIM and PIM associated with the directional antenna for removal from additional PIM measurements obtained by the PIM measurement device.

16. The method of claim 13, wherein arranging the PIM measurement device includes arranging the PIM measurement device so that the directional antenna is configured to transmit an RF signal having a boresight axis that is one or both of at an upward angle relative to horizontal and substantially vertical.

17. The method of claim 13, further comprising connecting a PIM calibration standard between the directional antenna and the PIM measurement device.

18. The method of claim 17, wherein the obtained PIM measurement is indicative of a known distance to a PIM generated by the PIM calibration standard.

* * * * *